(12) United States Patent
Sinclair et al.

(10) Patent No.: US 9,269,542 B2
(45) Date of Patent: Feb. 23, 2016

(54) PLASMA CATHODE CHARGED PARTICLE LITHOGRAPHY SYSTEM

(71) Applicant: Varian Semiconductor Equipment Associates, Inc., Gloucester, MA (US)

(72) Inventors: Frank Sinclair, Boston, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/070,148

(22) Filed: Nov. 1, 2013

(65) Prior Publication Data

US 2015/0123006 A1    May 7, 2015

(51) Int. Cl.
*H01J 37/317* (2006.01)
*H01J 37/32* (2006.01)

(52) U.S. Cl.
CPC ......... *H01J 37/3177* (2013.01); *H01J 37/3174* (2013.01); *H01J 37/32422* (2013.01)

(58) Field of Classification Search
CPC .............. H01J 37/3174; H01J 37/3177; H01J 37/3172; H01J 37/32422
See application file for complete search history.

(56) References Cited

U.S. PATENT DOCUMENTS

| | | | | |
|---|---|---|---|---|
| 6,087,615 A * | 7/2000 | Schork | ............. | H01J 27/08 219/121.43 |
| 6,888,146 B1 * | 5/2005 | Leung | ............. | B82Y 10/00 250/396 R |
| 6,924,493 B1 * | 8/2005 | Leung | ............. | B82Y 10/00 250/492.21 |
| 7,609,815 B2 * | 10/2009 | Leung | ............. | B82Y 10/00 378/136 |
| 2003/0209676 A1 * | 11/2003 | Loschner | ............. | B82Y 10/00 250/492.2 |
| 2008/0049888 A1 * | 2/2008 | Leung | ............. | B82Y 10/00 378/4 |
| 2008/0132046 A1 * | 6/2008 | Walther | ............. | H01J 37/08 438/513 |
| 2009/0256075 A1 * | 10/2009 | Kemen | ............. | H01J 37/045 250/307 |
| 2010/0288938 A1 * | 11/2010 | Platzgummer | ......... | B82Y 10/00 250/396 R |
| 2011/0068276 A1 * | 3/2011 | Kruit | ............. | B82Y 10/00 250/396 R |
| 2012/0228515 A1 | 9/2012 | Leavitt et al. | | |
| 2012/0248328 A1 | 10/2012 | Renau et al. | | |
| 2014/0097752 A1 | 4/2014 | Biloui et al. | | |
| 2015/0179409 A1 * | 6/2015 | Biloiu | ............. | H01J 37/32357 216/66 |

OTHER PUBLICATIONS

International Search Report and Written Opinion from corresponding PCT/US2014/063112, mailed Jul. 22, 2105.
Platzgummer, Elmar, et al., Electron multi-beam technology for mask and wafer writing at 0.1nm address grid, Alternative Lithographic Technologies V, Proc. of SPIE, 2013, pp. 1-12, vol. 8680, 868004, edited by William M. Tong, Douglas J. REsnick, spiedigitallibrary.org.

* cited by examiner

*Primary Examiner* — Wyatt Stoffa (57) ABSTRACT

In one embodiment, a system for patterning a substrate includes a plasma chamber; a power source to generate a plasma within the plasma chamber; and an extraction plate system comprising a plurality of apertures and disposed along a side of the plasma chamber. The extraction plate system is configured to receive an extraction voltage that biases the extraction plate system with respect to the plasma chamber wherein the plurality of apertures are configured to extract a plurality of respective charged particle beamlets from the plasma. The system further includes a projection optics system to direct at least one of the plurality of charged particle beamlets to the substrate.

16 Claims, 8 Drawing Sheets

PLASMA CATHODE CHARGED PARTICLE LITHOGRAPHY SYSTEM

FIELD

The present embodiments relate to lithography systems, and more particularly, to charged particle lithography systems.

BACKGROUND

In various types of lithography systems charged particles are used to pattern a substrate. Such charged particle lithography systems include electron and ion based lithography systems. In order to form an image, an electron-sensitive or ion-sensitive material such as photoresist is disposed on an outer surface of a substrate to intercept the respective electrons or ions. In direct write systems, a charged particle beam may be subject to random scan (vector scan) to write a pattern in serial fashion by scanning a charged particle beam into a photoresist or other target material. Other charged particle lithography systems provide a wide beam of charged particles that is divided into smaller beams or beamlets using a masking or patterning system in order to form an image in the photoresist. Generally, these latter systems produce a low emittance high brightness beam that illuminates the masking or patterning system. The image formed by dividing the wide beam into multiple beamlets is then projected onto a photoresist to define the pattern to be formed in the substrate.

Some charged particle lithography systems that generate multiple beamlets from a wider beam employ a fixed stencil mask in which a medium or membrane has a set of open regions defining a desired pattern through which charged particles are conducted toward the substrate. In other charged particle lithography systems, a programmable aperture plate that contains a set of regularly spaced holes may provide multiple different beamlets from the wide area beam. The programmable aperture plate system is also equipped with a multiplicity of control electrodes to switch an individual beamlet on or off depending on whether a desired portion of the substrate is to be illuminated or not.

For charged particle lithography systems that employ a fixed mask or programmable aperture plate system, most tools illuminate the fixed mask or programmable aperture plate system with a wide parallel beam. This beam typically originates from a small point source that produces a divergent beam. In order to focus the divergent beam to form a more parallel charged particle beam before patterning into smaller beamlets, a condenser lens system is provided upstream of the masking system. After passing through the fixed mask or programmable apertures the charged particle beam is then conducted through a projection optics system which may generate a desired image reduction to produce a desired pattern at the proper dimension on a substrate. One issue with such charged particle lithography systems is the complexity and size of the lithography system because of the necessity to generate a charged particle beam from a high brightness point source, to spread out the beam, and then collimate the beam before entering a mask. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a system for patterning a substrate includes a plasma chamber; a power source to generate a plasma within the plasma chamber; and an extraction plate system comprising a plurality of apertures and disposed along a side of the plasma chamber. The extraction plate system is configured to receive an extraction voltage that biases the extraction plate system with respect to the plasma chamber, wherein the plurality of apertures are configured to extract a plurality of respective charged particle beamlets from the plasma. The system further includes a projection optics system to direct at least one of the plurality of charged particle beamlets to a substrate.

In a further embodiment, a method of patterning a substrate includes generating a plasma comprising charged particles in a plasma chamber, extracting the charged particles from the plasma through a plurality of apertures to form a plurality of charged particle beamlets, deflecting a first charged particle beamlet of the plurality of beamlets when the charged particle beamlet passes though a first aperture of the plurality of apertures; and transmitting a second charged particle beamlet of the plurality of beamlets though a second aperture of the plurality of apertures without deflection, wherein the first charged particle beamlet does not impinge upon the substrate and wherein the second charged particle impinges upon the substrate.

DETAILED DESCRIPTION

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide novel lithography apparatus. In various embodiments a charged particle lithography system includes a plasma chamber that acts as a wide area source of charged particles. Such a wide area source may be employed to provide efficient and rapid patterning of substrates according to various embodiments. An advantage of using a plasma-based wide area source is that use of a plasma chamber facilitates the ability to direct charged particles through a patterning system with a high degree of parallelism so that the charged particles form the same angle when impinging upon the substrate to be patterned. Another advantage provided by the present embodiments is the high degree of uniformity of charged particle density across the area of a patterning system that is facilitated by the use of a plasma chamber. Moreover a plasma source provides various adjustable parameters that may be tuned to adjust plasma conditions to reduce energy spread of charged particles incident upon a substrate, thereby further improving the uniformity of the patterning process. Achieving a low energy spread is facilitated by the use of a large area which thus requires a lower plasma density than the point sources used in the prior art.

In various embodiments a plasma source for generating charged particles is used in conjunction with an extraction plate system to generate charged particle beamlets for patterning a substrate. Such an extraction plate system may be designed according to known aperture systems used for charged particle lithography. Such systems may include programmable apertures or fixed apertures that are used to control exposure of the substrate being patterned to the beamlets. Systems designed with programmable apertures have elsewhere been referred to as "maskless systems" because the programmable apertures pattern a substrate without being configured in a fixed mask pattern. However, such systems are referred to herein merely as "extraction plate systems." One common feature of the extraction plate systems of the present embodiments and that of known systems is that an aperture plate is exposed to a flux of charged particles distributed over a wide area comparable in size to that of the aperture plate. The flux of charged particles are then transformed into multiple beamlets when passing through the multiple apertures that are contained in the aperture plate. As detailed below, however, many advantages that accrue from the present embodiments stem from the nature of the plasma sources used to create the wide area of charged particles that are patterned by an extraction plate system, which differ from conventional point source systems.

Figure 1:
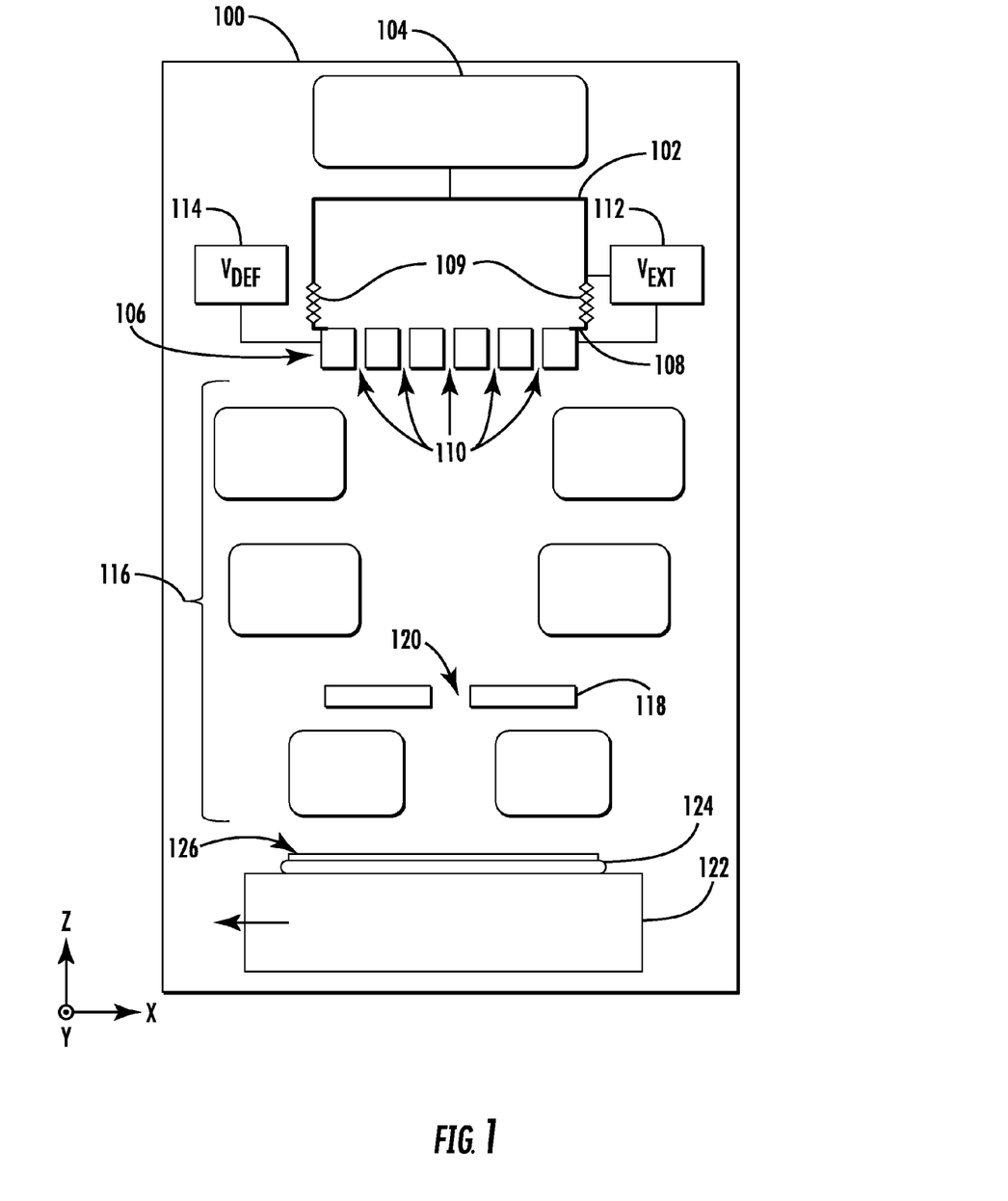
FIG. 1 presents an exemplary charged particle lithography system consistent with embodiments of the present disclosure.

FIG. 1 depicts a system 100 that is used for charged particle lithography in accordance with embodiments of the disclosure. The system 100 in particular may be employed to pattern a substrate 124 placed therein. System 100 includes a plasma chamber 102 that receives power from a power source 104. In various embodiments, the power source 104 may be an RF power source for generating a capacitively coupled plasma or for generating an inductively coupled plasma; a microwave power source, or an arc discharge power source. The embodiments are not limited in this context. The plasma chamber 102 may have any convenient shape and may form a circular or rectangular shape in the X-Y plane of the Cartesian coordinate system shown. The embodiments are not limited in this context.

As further shown in FIG. 1, an extraction plate system 106 is disposed along one side 108 of the plasma chamber 102 and may form a portion or an entirety of a wall of that side of the plasma chamber 102. When a plasma (not shown) is generated in the plasma chamber 102, the extraction plate system 106 may be used to extract multiple charged particle beamlets from the plasma chamber 102 through multiple apertures 110, some of which beamlets are directed to the substrate 124 for patterning of the substrate 124. To extract charged particles from the plasma chamber 102, an extraction voltage supply 112 is coupled to the plasma chamber 102 and to the extraction plate system 106 to generate an extraction voltage $V_{EXT}$ therebetween. An annular insulator 109 is used to separate the potential of the plasma generation region from the potential of the aperture plate. In various embodiments, the magnitude of the extraction voltage $V_{EXT}$ ranges from 5 kV to 100 kV, although the embodiments are not limited in this context. In various embodiments, the extraction plate system 106 may be a single extraction plate or may include multiple extraction plates.

In accordance with various embodiments the extraction voltage supply 112 may supply $V_{EXT}$ as a negative or positive voltage, so that the extraction plate system 106 is biased negatively or positively with respect to the plasma chamber 102. In the case where the extraction plate system 106 is biased positively with respect to plasma chamber 102, electrons may be extracted from the plasma chamber 102 to form multiple electron beamlets that are directed to the substrate 124. In the case where the extraction plate system 106 is biased negatively with respect to plasma chamber 102, positive ions may be extracted from the plasma chamber 102 to form multiple positive ion beamlets that are directed to the substrate 124. In other embodiments, application of a positive $V_{EXT}$ to the extraction plate system 106 with respect to plasma chamber 102 may be used to extract negative ions although other components (not shown) may be needed to generate negative ions within the plasma chamber 102 as will be appreciated by those of skill in the art.

The system 100 further includes a multiplicity of deflection voltage sources 114 that are employed to provide a deflection voltage $V_{DEF}$ to apertures 110 within the extraction plate system 106, as detailed below. In brief, the deflection voltage sources 114 are used to individually control the deflection voltage applied to an individual aperture. This allows the system 100 to control whether or not a given charged particle beamlet is to reach the substrate 124 for patterning by using a deflection voltage on select apertures to control trajectory of a charged particle beamlet passing therethrough. The deflection voltage source 114 may be a programmable voltage deflection source such that a given pattern of deflection voltages for different apertures 110 is programmed in the deflection voltage source 114 to generate a given pattern of exposure of charged particle beams at the substrate 124.

The system 100 also includes a projection optics system 116, which is used to control the collection of charged particle beamlets before impinging upon the substrate. The projection optics system 116 may be a conventional system as used in conventional charged particle lithography systems to control focus and dimension of the charged particle beamlets. For example, the extraction plate system 106 may form a pattern of beamlets that is reduced in size by the projection optics system 116. Details of such projection optics systems are well known and are not discussed further herein.

The system 100 contains a stopping plate 118 that acts to screen out charged particle beamlets that are deflected by the extraction plate system 106. In this manner, the extraction plate system 106 may select which charged particle beamlets are to reach the substrate 124, as detailed below. Also included in system 100 is a substrate stage 122 that may translate a substrate 124, for example, at least along an X-direction and Y-direction in order that different regions of a substrate 124 are exposed to charged particles. For example, the system 100 may generate a 100x or 200x reduction in image size between the extraction plate system 106 and substrate 124. Thus, an extraction plate system 106 that spans 20 cm along the X-direction may generate a pattern on the substrate 124 that spans 2 mm in one example. Therefore, in order to expose a substrate 124 having dimensions on the order of many centimeters, the substrate stage 122 may be scanned along the X-direction and Y-direction between a series of exposures.

Figure 2A:
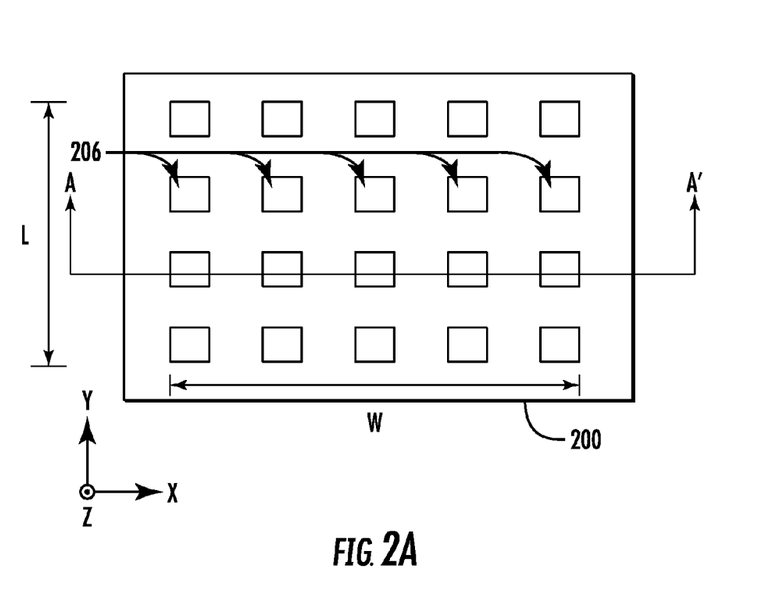
FIG. 2A depicts a top plan view of an extraction plate system according to various embodiments.
Figure 2B:
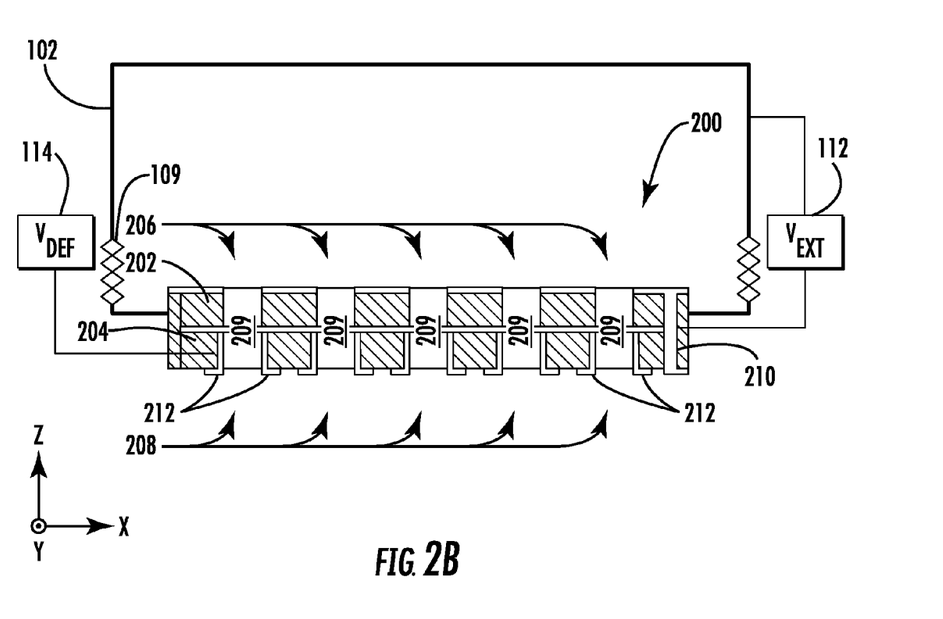
FIG. 2B depicts a side cross-sectional view of the extraction plate system of FIG. 2A as situated within a plasma chamber.

FIGS. 2A and 2B depict a top plan view and side view, respectively, of an extraction plate system 200 that may be used in the system 100 to pattern a substrate. In particular, FIG. 2B presents a cross-sectional view of the extraction plate system 200 along the direction A-A'. The extraction plate system 200 includes an aperture plate 202 and blanking plate 204 that are affixed to one another. The aperture plate 202 and blanking plate 204 each include a respective array of apertures 206, 208, which are aligned to one another. The apertures 206 are aligned with the apertures 208 so that an array of apertures 209 are formed that extend through the entire extraction plate system 200. The apertures 209 may conduct charged particle beams that are extracted from a plasma (not shown) formed in the plasma chamber 102.

The extraction plate system 200 also contains an electrode 210 that is coupled to the extraction voltage supply 112 in order to apply a bias between the plasma chamber 102 and extraction plate system 200. In this manner, when a plasma is formed within the plasma chamber 102 the extraction plate system 200 may accelerate charged particles from the plasma to a desired energy. The blanking plate 204 further includes deflection electrodes 212 that are coupled to the deflection voltage source 114. Each deflection electrode 212 is aligned with a respective aperture 208 and includes two different electrodes. Thus, a deflection voltage may be applied between the two different electrodes that make up each deflection electrode 212. This deflection voltage serves to generate a deflection field that is configured to deflect a charged particle passing through an aperture 209. The deflection voltage source 114 may be programmable in such a manner that a deflection voltage may be sent individually to any deflection electrode 212. Although not explicitly shown in FIGS. 2A, 2B, the deflection electrodes 212 may be connected to the deflection voltage source through wiring provided within or on the extraction plate system 200.

In order to conveniently generate features having small dimensions the aperture size in the X- and Y-direction for apertures 209 may be on the order of one to ten micrometers. Referring also to FIG. 1, this allows a system such as system 100 to generate charged particle beamlets having a dimension on the order of ten to one hundred nanometers depending upon the reduction or demagnification performed by the projection optics system 116. The embodiments are not limited in this context.

Although FIG. 2B in particular depicts an embodiment in which the extraction plate system 200 includes two different plates having apertures, in other embodiments, an extraction plate system may be a single aperture plate in which deflection electrodes are disposed within apertures as in blanking plate 204. Moreover, the electrodes may extend partially along the length of apertures in a single aperture plate embodiment, or may extend along the entire length of such apertures.

Figure 3A:
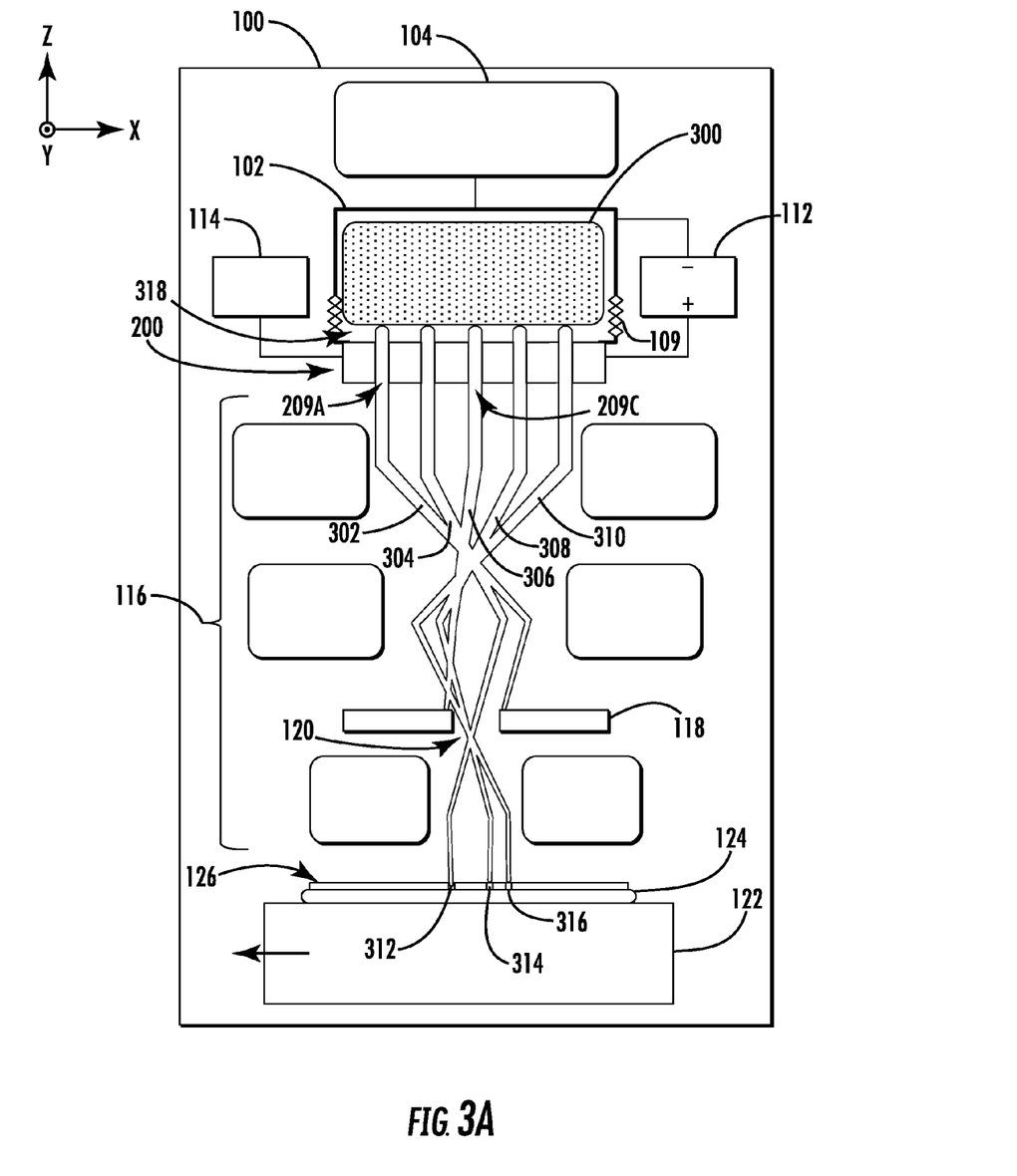
FIG. 3A depicts a side cross-sectional view of the exemplary charged particle lithography system of FIG. 1 during operation.

FIG. 3A depicts one scenario for operation of the system 100 in accordance with various embodiments. In FIG. 3A gas species (not separately shown) may be admitted to the plasma chamber 102, after which a plasma 300 is generated when the power source 104 supplies power to the plasma chamber 102. Examples of suitable gas species to generate the plasma 300 include an inert gas such as He, Ne, Ar, Kr, Xe, or a hydrogen-containing gas such as $H_2$, $H_2O$, $NH_3$. This may limit etching or reaction with aperture plate components. However the embodiments are not limited in this context. For example, in embodiments of positive ion lithography in which ions are to be implanted into a substrate layer to patter the substrate layer, the gas species may be chosen to generate any desired positive ion.

Consistent with the present embodiments, the plasma 300 is generated in a manner to provide a uniform flux of charged particles across the width W and across the length L (see FIG. 2A) of the array of apertures 209 that are used to extract the charged particles. For example, as illustrated in FIG. 3A, the size of the plasma chamber 102 may be arranged such that, proximate the extraction plate system 200, the width of the plasma 300 along the X direction and length of the plasma along the Y direction are greater than the respective width W and length L or the array of apertures 209. Using such a geometry, for embodiments in which the power source is an RF power source that generates the plasma 300 via inductive or capacitive coupling (not explicitly shown in FIG. 3), the variation of charge particle density across the width W and length L or the array of apertures 209 may be less than 3%. In this manner, the variation in charged particle flux per unit area conducted through different apertures 209 of the extraction plate system 200 may also be less than 3%.

As further shown in FIG. 3A, multiple charged particle beamlets 302, 304, 306, 308, 310, are extracted from the plasma 300 through different apertures 209 (see FIG. 2B). As noted above each of these charged particle beamlets 302-310 may carry the same charged particle flux per unit area. Thus, any of beamlets 302-310 that reach the substrate 124 may alter the film 126 in the same manner for a given exposure time.

The illustration of FIG. 3A depicts examples of the use of the deflection voltage source to pattern the substrate 124 by controlling which charged particle beamlets reach the substrate 124. In particular, the charged particle beamlets 302 and 306 are deflected when passing through respective apertures 209A and 209C in a manner that causes the charged particle beamlets 302 and 306 to be intercepted by the stopping plate 118. The other charged particle beamlets 304, 308, and 310 pass through the extraction plate system 200 without deflection, and are directed through the aperture 120 of the stopping plate 118. When the charged particle beamlets 304, 308, 310 impact the film 126, the film 126 is altered, forming a pattern of respective altered regions 312, 314, and 316. Other charged particle beamlets within the array of apertures 209 may be directed to the substrate 124 or intercepted by the stopping plate 118 in order to transfer a desired pattern into the film 126.

In some embodiments, an extraction plate system such as that generally represented by the extraction plate system 200 may contain many thousands of apertures, for example 500,000 apertures arranged in a two dimensional array. Thus, a substrate 124 may be processed by many hundreds of thousands of parallel charged particle beamlets, which may facilitate rapid patterning of a substrate 124.

Figure 3B:
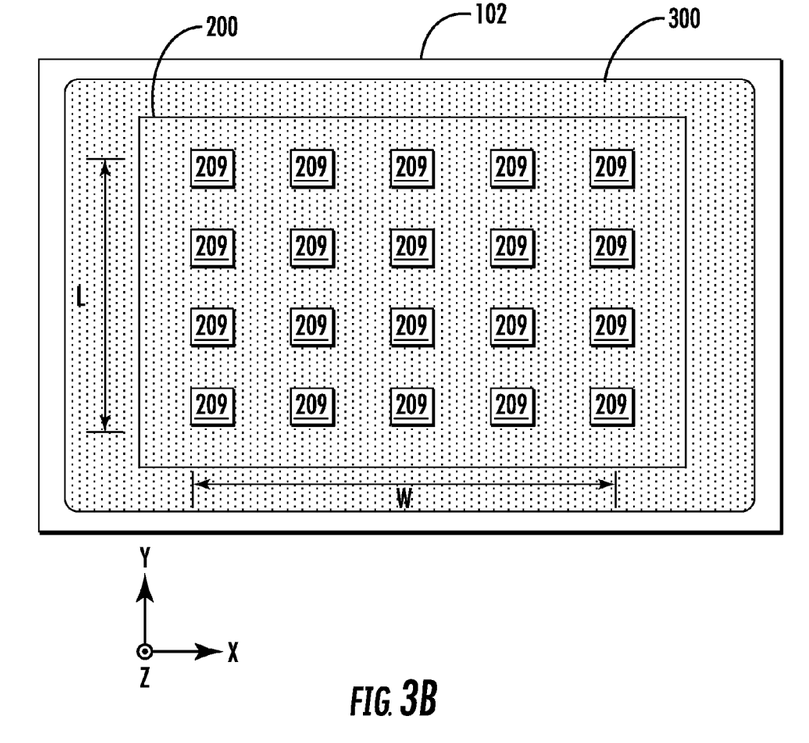
FIG. 3B depicts a top plan view of the extraction plate system and plasma chamber of FIG. 3A during operation.

FIG. 3B presents a top plan view of a plasma chamber 102 during operation. As shown, when the plasma 300 is generated within the plasma chamber 102 the plasma 300 effectively acts as a wide area charged particle source that may cover an area as large or larger than the area (WL) spanned by the array of apertures 209. As evident from FIG. 3A and FIG. 3B, this geometry contrasts with conventional charged particle apparatus that are based upon point sources where the charged particles spread out over a larger area before entering an aperture plate or mask. Instead, in the system 100 electrons or ions that are extracted from the plasma 300 cross the plasma sheath 318 and enter the apertures 206 (209) with substantially parallel trajectories at perpendicular incidence with respect to a surface of the extraction plate system 200. Thus, the charged particle flux per unit area in the X-Y plane for charged particles exiting the plasma 300 is the same as the charged particle flux per unit area of charged particles entering the apertures 209. In other words, there is no spreading out of charged particles as they traverse the plasma sheath to impact the extraction plate system 200.

Furthermore, as noted above the projection optics system 116 may generate a 100x or 200x linear reduction from the extraction plate system 200 to substrate 124 in the size of the pattern or image formed by an array of charged particle beams. This corresponds to a reduction factor for the area of a pattern formed by the charged particle beams of $100^2$ or $200^2$. Thus, the original area (LW) formed by the array of charged particle beams at the extraction plate system 200 may be reduced to an area LW/40,000 at the substrate after the charged particle beams traverse the projection optics system 116. The cross-sectional area (in the X-Y plane) of each individual charged particle beamlet may be reduced by a similar factor. In this manner, the flux per unit area of charged particles within an individual charged particle beamlet arriving at substrate 124 may be up to 40,000 times the flux per unit area of charged particles entering the apertures 209. Since the charged particles do not spread out during extraction from the plasma 300, the volume density of charged particles in the plasma 300 that is needed to provide a given charged particle dose for patterning a substrate 124 may therefore by much lower compared to that required in high brightness point sources in conventional charged particle lithography systems.

Figure 4:
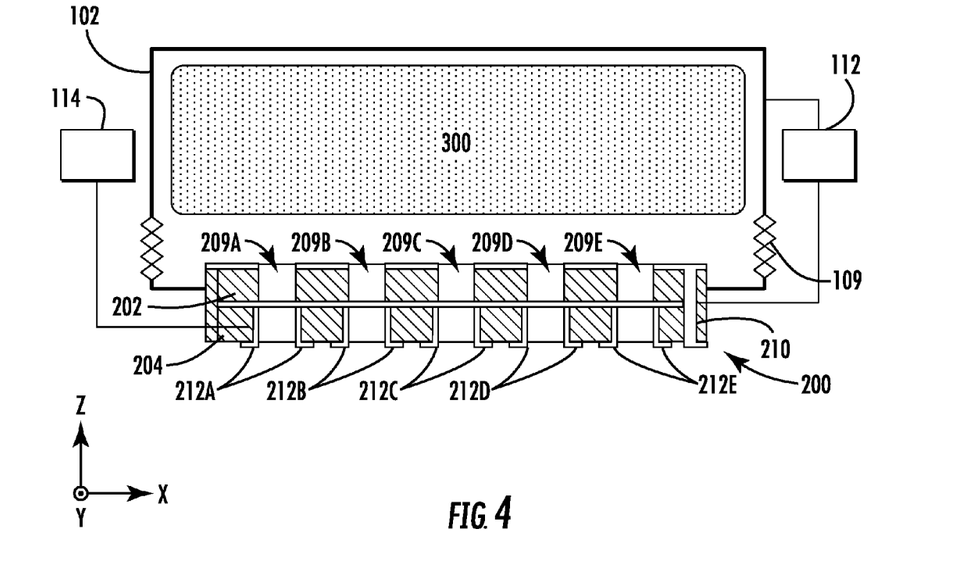
FIG. 4 depicts an exemplary charged particle lithography system during a first stage of generation of charged particle beamlets for patterning a substrate consistent with the present embodiments.
Figure 5:
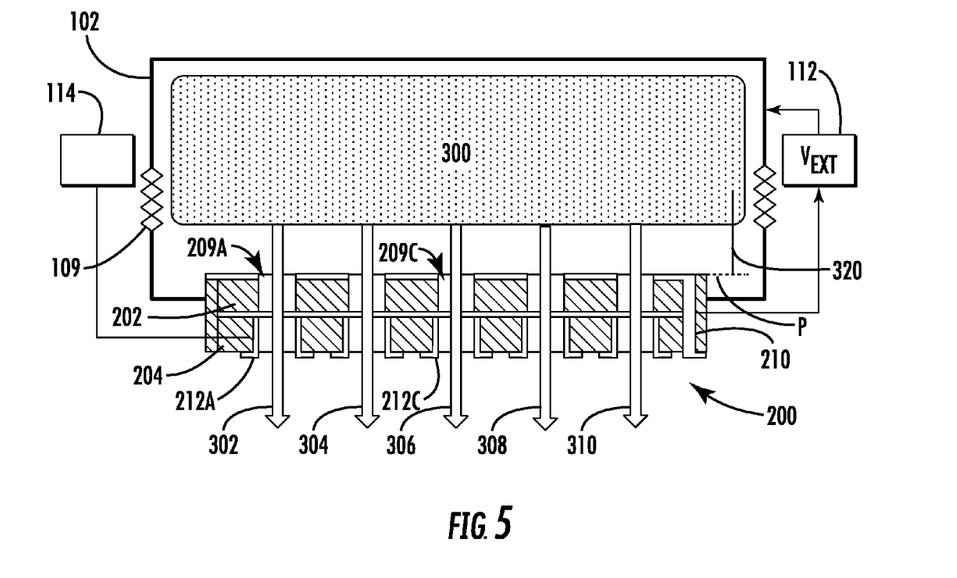
FIG. 5 depicts the system of FIG. 4 during a second stage of generation of charged particle beamlets for patterning a substrate.
Figure 6:
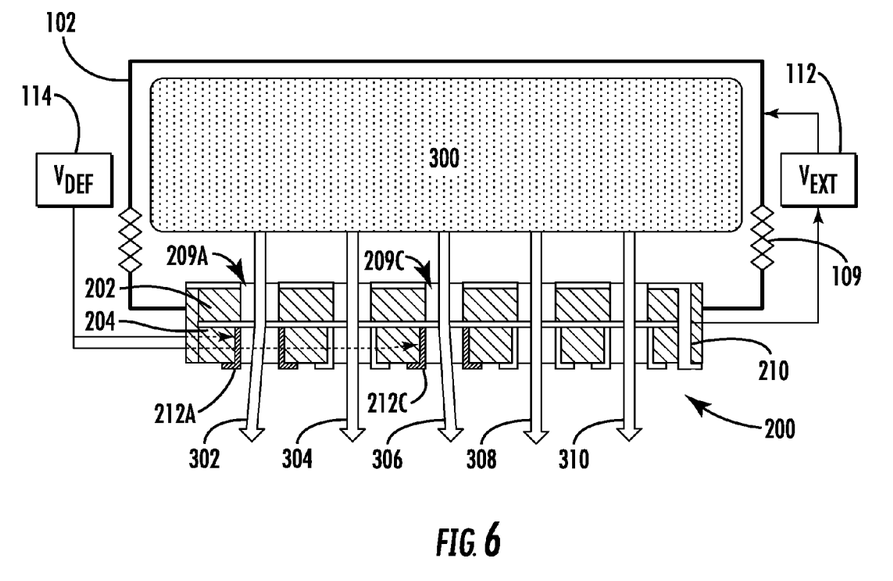
FIG. 6 depicts the system of FIG. 4 during a third stage of generation of charged particle beamlets for patterning a substrate.

To explain the operation of the system 100 shown in FIG. 3 in more detail, FIG. 4, FIG. 5 and FIG. 6 illustrate different stages during generation of charged particle beamlets for patterning the substrate 124. For clarity, only a plasma chamber 102, extraction plate system 200, and relevant voltage sources are shown. In FIG. 4, the plasma 300 is generated within the plasma chamber 102 via use of a power source (not shown). Consistent with the present embodiments, the plasma 300 is generated to provide a uniform density of charged particles across an area defined by the array of apertures 209 (see FIG. 3B). At this stage, no extraction voltage is supplied between the extraction plate system 200 and plasma chamber 102. Accordingly, no charged particle beamlets are extracted through the extraction plate system 200. Various parameters such as plasma power, gas pressure, gas flow, and other parameters may be adjusted to adjust the plasma uniformity to a desired level.

In FIG. 5, an extraction voltage $V_{EXT}$ is applied between the plasma chamber 102 and extraction plate system 200 while the plasma 300 is present in the plasma chamber 102. This results in the acceleration of charged particles from the plasma 300 to form the charged particle beamlets 302, 304, 306, 308, and 310 shown. The charged particles may be accelerated from the plasma 300 toward the aperture plate 202 such that their trajectories form an angle of incidence that is perpendicular to the plane P defined by an upper surface of the aperture plate 202, or the charged particles may impinge upon the aperture plate 202 at an angle of incidence of +0.5 degrees to −0.5 degrees with respect to a perpendicular 320 to the plane P.

In the scenario shown in FIG. 5 no deflecting voltage has been applied to apertures of the extraction plate system 200. Accordingly, the charged particle beamlets 302, 304, 306, 308, and 310 do not experience any deflecting electric field in the X-Y plane that may alter their trajectories and may pass through the extraction plate system 200 having trajectories that are perpendicular to the plane P.

In order to pattern a substrate, selected apertures of the extraction plate system 200 may be provided with a deflecting voltage so that charged particle beams passing through the selected aperture are deflected in a desired fashion. This is shown in the scenario depicted in FIG. 6. As illustrated, a plasma 300 is ignited in the plasma chamber 102 and an extraction voltage $V_{EXT}$ applied between the plasma chamber 102 and extraction plate system 200. The charged particle beamlets 302, 304, 306, 308, 310 are thereby extracted through respective apertures 209A, 209B, 209C, 209D, and 209E. However, in this instance a deflecting voltage $V_{DEF}$ is also applied to deflection electrodes 212A and 212C of respective apertures 209A and 209C. This deflecting voltage alters the trajectories of respective charged particle beamlets 302, 306, which may result in their being blocked from striking a substrate. At the same time no deflecting voltage is applied to the deflection electrodes 212B, 212D, and 212E of respective apertures 209B, 209D, and 209E, such that the charged particle beamlets 304, 308, and 310 pass through the extraction plate system 200 with their trajectories unperturbed. A result of the scenario of FIG. 6 is that the charged particle beamlets 304, 308, 310 may be directed via projection optics to reach the substrate 124 to generate exposed regions where a film disposed on the substrate is impacted, while the charged particle beamlets 302, 306 are blocked from reaching the substrate, as discussed above with respect to FIG. 3.

In additional embodiments, cusp confinement may be provided to a plasma chamber so as to reduce plasma temperature and improve uniformity across a plasma. For example, a known "picket fence" arrangement of magnets may be placed proximate plasma chamber walls in which the arrangement of north/south poles are alternated in adjacent magnets to generate the cusp confinement. The cusp confinement acts to confine a plasma away from walls of the plasma chamber by acting as a reflector for electrons. The reduction of plasma temperature may have multiple benefits for charged particle lithography. For one, the concomitant reduction in charged particle energy within the plasma may reduce the energy spread of charged particle beamlets that arrive at the substrate. In addition the reduced charged particle energy spread may reduce chromatic aberration of the projection optics system 116, since chromatic aberration is proportional to the charged particle energy spread for a given nominal energy of a charged particle beam.

Figure 7:
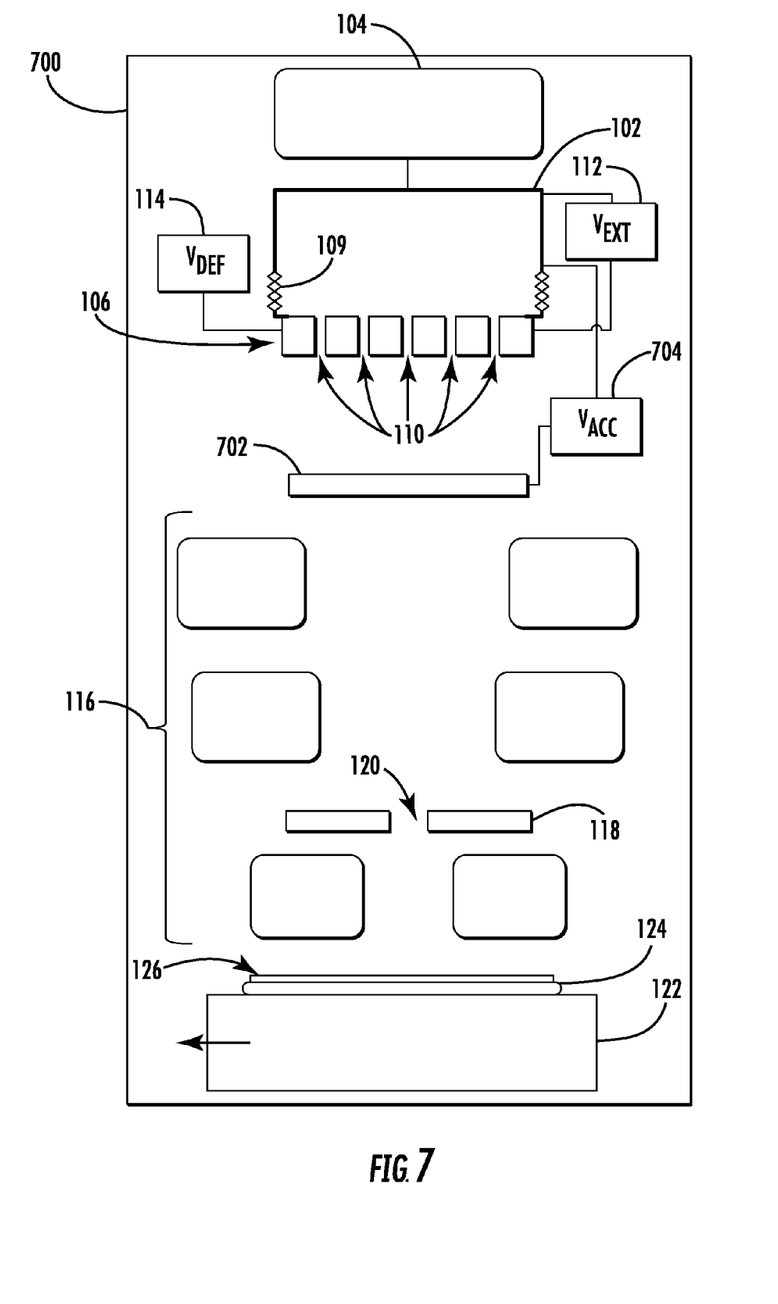
FIG. 7 presents another exemplary charged particle lithography system consistent with embodiments of the present disclosure.

In further embodiments, acceleration electrodes may be placed between an extraction plate system and substrate to further accelerate charged particles to a desired energy. For example, if 30 keV energy is to be imparted to a charged particle beam for patterning a substrate, 15 kV voltage may be applied between the extraction plate system 200 and plasma chamber 102 and an additional 15 kV may be applied by an acceleration electrode or electrode placed between the extraction plate system and substrate. FIG. 7 illustrates an embodiment of a system 700 that is configured similarly to system 100 except that an acceleration electrode 702 is provided downstream of the extraction plate system 200. An acceleration voltage may be applied by acceleration voltage source 704 to increase the energy of a charged particle beamlet directed to the substrate as desired. This may be useful, for example, in positive ion lithography processing to reduce the energy of positive ions that traverse the extraction plate system 200, thereby reducing any etching processes that may take place if an ion should strike an surface of the extraction plate system 200.

Figure 8:
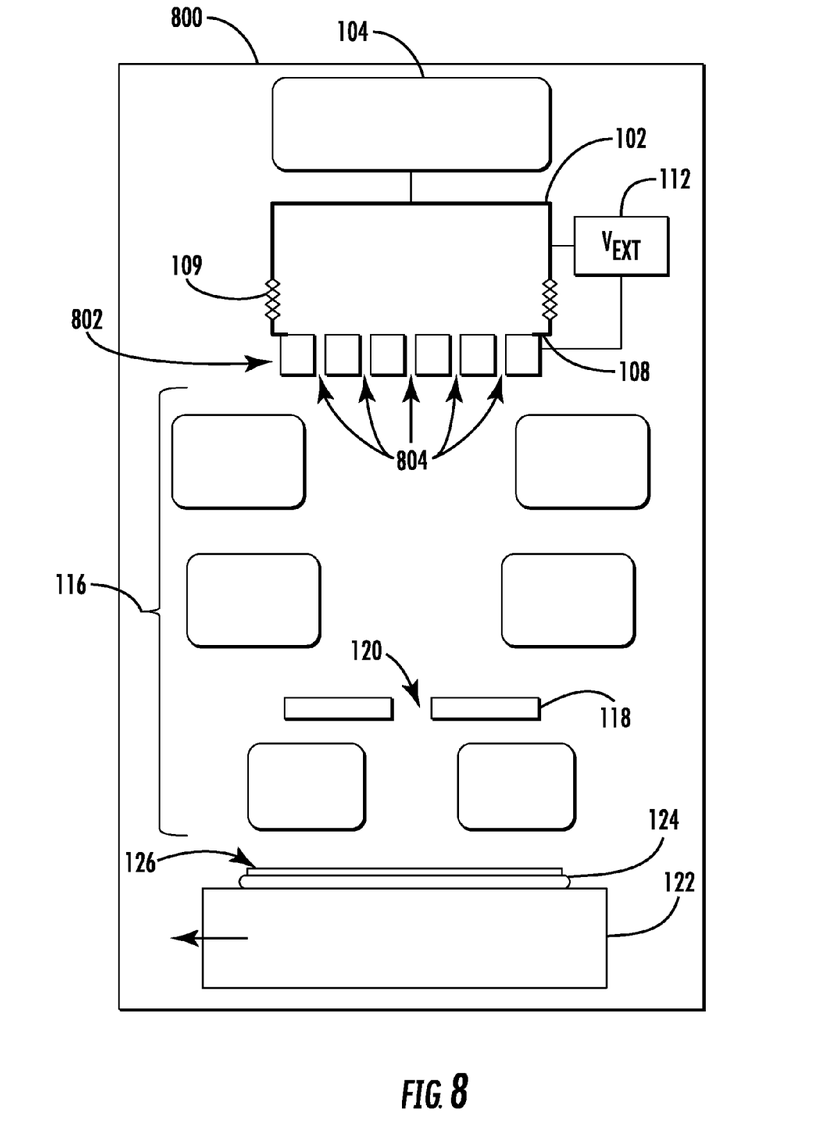
FIG. 8 presents a further exemplary charged particle lithography system consistent with embodiments of the present disclosure.

In still additional embodiments, an extraction plate system may be constructed using an aperture plate having a fixed pattern of apertures that define a pattern to be transferred to a substrate. Thus, all the charged particles that pass through the apertures of such an extraction plate system may have trajectories that are configured to strike the substrate. FIG. 8 depicts one embodiment of a system 800 that differs from the system 100 in that the extraction plate system is a fixed aperture plate or stencil mask. As illustrated, the extraction plate system 802 is disposed along one side of the plasma chamber 102 to receive ions or electrons when an extraction voltage is applied between the extraction plate system 802 and plasma chamber 102. The extraction plate system may include a pattern of apertures 804 that define a pattern to be transferred to the substrate 124. The extraction plate system 802 may thereby extract a set of charged particle beamlets having any combination of shapes to generate a pattern that is to be transferred to form a desired pattern in reduced size at the substrate 124.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A system for patterning a substrate, comprising:
   a plasma chamber;
   a power source to generate a plasma within the plasma chamber; an extraction plate system comprising a plurality of apertures and disposed along a side of the plasma chamber, the extraction plate system configured to receive an extraction voltage that biases the extraction plate system with respect to the plasma chamber, wherein the plurality of apertures are configured to extract a plurality of respective charged particle beamlets from the plasma; and
   a projection optics system configured to receive the plurality of charged particle beamlets and direct at least one of the plurality of charged particle beamlets to the substrate, wherein the extraction plate system comprises:
   an aperture plate comprising a first aperture array having a first plurality of apertures that are configured to generate the plurality of beamlets; and
   a blanking plate comprising a second aperture array having a second plurality of apertures,
   wherein the first plurality of apertures are aligned with the second plurality of apertures to form an aperture array, and the second plurality of apertures include a respective plurality of deflection electrodes, the aperture plate and blanking plate being positioned between the plasma chamber and the projection optics system.

2. The system of claim 1, wherein the power source comprises an inductively coupled RF power source, a capacitively coupled RF power source, a microwave source, or an arc discharge supply.

3. The system of claim 1, further comprising a voltage supply configured to supply the extraction voltage between the extraction plate system and the plasma chamber.

4. The system of claim 3, wherein the extraction voltage establishes a positive bias of the extraction plate system with respect to the plasma chamber, wherein the charged particle beamlets are electrons.

5. The system of claim 1 wherein the aperture plate includes a surface adjacent the plasma chamber that defines a plane, wherein the charged particles impinge upon the aperture plate at an angle of incidence of +0.5 degrees to −0.5 degrees with respect to a perpendicular to the plane.

6. The system of claim 1, further comprising a programmable deflection voltage source coupled to the plurality of deflection electrodes to apply a deflection voltage to selected apertures of the aperture array, wherein when a deflection voltage is applied to a deflection electrode of an aperture of the aperture array, a charged particle beam passing therethrough is deflected.

7. The system of claim 1, further comprising a substrate stage configured to scan the substrate in a direction perpendicular to an incidence direction of the charged particle beamlets.

8. The system of claim 1, wherein the first plurality of apertures are arranged in a two dimensional array that defines a first area, and wherein the projection optics system is configured to focus the plurality of charged particle beamlets to define a second area, wherein a ratio of the first area to second area is 10,000 or greater.

9. A method of patterning a substrate, comprising:
   generating a plasma comprising charged particles in a plasma chamber;
   extracting the charged particles from the plasma through a plurality of apertures in an extraction plate system to form a plurality of charged particle beamlets; and
   directing at least one charged particle beamlet of the plurality of charged particle beamlets using projection optics to the substrate, wherein the extraction plate system comprises:
   an aperture plate comprising a first aperture array having a first plurality of apertures that are configured to generate the plurality of beamlets; and
   a blanking plate comprising a second aperture array having a second plurality of apertures,
   wherein the first plurality of apertures are aligned with the second plurality of apertures to form an aperture array, and the second plurality of apertures include a respective plurality of deflection electrodes, the aperture plate and blanking plate being positioned between the plasma chamber and the projection optics.

10. The method of claim 9, comprising generating the plasma using one of an inductively coupled RF power source, a capacitively coupled RF power source, a microwave source, or an arc discharge supply.

11. The method of claim 9, wherein extracting the charged particles from the plasma comprises generating an extraction voltage between the extraction plate system and the plasma chamber.

12. The method of claim 11, comprising providing the extraction voltage as a positive bias of the extraction plate system with respect to the plasma chamber, wherein the charged particle beamlets are electrons.

13. The method of claim 11, wherein the extraction plate system has a surface adjacent the plasma chamber defining a plane, wherein the charged particles impinge upon the extraction plate system at an angle of incidence of +0.5 degrees to −0.5 degrees with respect to a perpendicular to the plane.

14. The method of claim 9, further comprising deflecting a select charged particle beamlet of the plurality of charged particle beamlets when the select charged particle beamlet passes through a select aperture of the plurality of apertures, wherein the select charged particle beamlet does not impinge upon the substrate.

15. The method of claim 14, wherein deflecting the select charged particle beamlet further comprises applying a deflection voltage to a deflection electrode of the select aperture.

16. A system for patterning a substrate, comprising:
a plasma chamber;
a power source to generate a plasma within the plasma chamber;
an extraction plate system comprising a plurality of apertures and disposed along a side of the plasma chamber, the extraction plate system configured to receive an extraction voltage that biases the extraction plate system with respect to the plasma chamber,
wherein the plurality of apertures are arranged in an aperture array that defines a first area and is configured to extract a plurality of respective charged particle beamlets from the plasma, and wherein the plurality of apertures include a respective plurality of deflection electrodes, wherein the plurality of apertures of the extraction plate system are formed within an aperture plate comprising a first aperture array having a first plurality of apertures that are arranged in a two dimensional array and configured to generate the plurality of beamlets, and within a blanking plate comprising a second aperture array having a second plurality of apertures arranged in a two dimensional array and aligned with the first plurality of apertures, the second plurality of apertures including the respective plurality of deflection electrodes; and
a projection optics system configured to receive the plurality of charged particle beamlets and direct at least one of the plurality of charged particle beamlets to the substrate,
wherein the projection optics system is configured to focus the plurality of charged particle beamlets to define a second area, and wherein a ratio of the first area to second area is 10,000 or greater, the aperture plate and blanking plate being positioned between the plasma chamber and the projection optics system.

* * * * *